United States Patent
Schaffer et al.

(10) Patent No.: US 9,647,645 B1
(45) Date of Patent: *May 9, 2017

(54) LOW VOLTAGE TO HIGH VOLTAGE LEVEL TRANSLATOR THAT IS INDEPENDENT OF THE HIGH SUPPLY VOLTAGE

(71) Applicant: XCELSEM, LLC, Santa Clara, CA (US)

(72) Inventors: Gregory L. Schaffer, Cupertino, CA (US); Maarten Jeroen Fonderie, Santa Clara, CA (US)

(73) Assignee: XCELSEM, LLC, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/152,207

(22) Filed: May 11, 2016

(51) Int. Cl.
*H03K 3/356* (2006.01)

(52) U.S. Cl.
CPC .................... *H03K 3/356* (2013.01)

(58) Field of Classification Search
CPC H03K 3/08; H03K 3/027; H03K 3/02; H03K 3/013; H03K 3/356; H03K 3/01; H03K 3/0315; H03K 5/08; H03K 5/2481; H03K 5/003; H03K 5/24; H03K 7/08
USPC ........................................................ 327/333
See application file for complete search history.

(56) References Cited

U.S. PATENT DOCUMENTS 6,633,192 B2 * 10/2003 Tsuchiya .............. H03K 17/102
326/68
2013/0162294 A1 * 6/2013 Henmi ........... H03K 19/018507
326/80

FOREIGN PATENT DOCUMENTS

JP 1992-284021 8/1992
JP 1993-199101 6/1993

\* cited by examiner

*Primary Examiner* — John Poos
(74) *Attorney, Agent, or Firm* — Gary Stanford; Huffman Law Group, PC

(57) ABSTRACT

A low voltage to high voltage level translator that is independent of the high supply voltage. The translator includes first and second transistors with current terminals coupled to a first supply voltage and control terminals that are cross-coupled to one of first and second output nodes. The translator includes first and second input stages each having a first current terminal coupled to a second supply voltage, having a second current terminal coupled to one of the first and second output nodes, and having a control terminal coupled to one of first and second input nodes. The translator further includes first and second resistors, each having a first terminal coupled to the second current terminal of one of the first and second transistors and a second terminal coupled to one of the first and second output nodes. The added resistors enable wider voltage translation and avoid conventional configuration issues.

19 Claims, 6 Drawing Sheets

LOW VOLTAGE TO HIGH VOLTAGE LEVEL TRANSLATOR THAT IS INDEPENDENT OF THE HIGH SUPPLY VOLTAGE

BACKGROUND OF THE INVENTION

Field of the Invention

The present invention relates in general to voltage level translation, and more particularly to a low voltage to high voltage level translator that is independent of the high supply voltage.

Description of the Related Art

Level translators are used for translating low voltage logic signals to a higher voltage level. For example, a common application is to convert 3 Volt (V) logic signals to 5V logic signals. A conventional design works well when the low and high voltages are sufficiently close to each other, including the aforementioned example, in which the low to high translation ratio is not too low (meaning that the higher voltage is not significantly higher than the lower voltage). The conventional level translator design works best if the ratio of the low to high voltages is greater than 0.5. For ratios lower than 0.5, such as, for example, 0.2 (e.g., 1V to 5V) the conventional design becomes unwieldy when the voltage translator is implemented using field-effect transistors (FETs) because of the large values for channel width (W) and length (L) of the FETs.

Digital logic circuits are trending to lower and lower voltages, e.g., 2.5V, 1.8V, 1.5V, 1.2V, 1.0V, etc., in which voltage translation is generally made to the same higher voltage output. As the input voltage decreases, the FET gate areas increase resulting in a higher gate-source capacitance. The higher gate-source capacitance slows down the switching speed of the level translator. Another issue is that conventional designs are typically optimized only at a specific low voltage to high voltage ratio.

SUMMARY OF THE INVENTION

A low voltage to high voltage level translator as described herein is independent of the high supply voltage. In one embodiment, the translator includes first and second transistors of a first conductivity type each having a current terminal coupled to a first supply voltage and each having a control terminal cross-coupled to one of first and second output nodes. The translator includes first and second input stages of a second conductivity type each having a first current terminal coupled to a second supply voltage, having a second current terminal coupled to one of the first and second output nodes, and having a control terminal coupled to one of first and second input nodes. The translator further includes first and second resistors, each having a first terminal coupled to the second current terminal of one of the first and second transistors and a second terminal coupled to one of the first and second output nodes.

The conductivity types may each be P-type or N-type or the like, and may include or comprise P-channel or N-channel transistors, such as field-effect transistors (FETs) or MOS transistors or the like. The first and second input stages may each be a single input transistor if able to withstand the full voltage between the first and second supply voltages. Alternatively, the first and second input stages may be implemented as cascoded transistors including higher voltage bias transistors provided to isolate the lower voltage input transistors from the higher voltage levels.

The width to length dimension ratio of each of the input transistors of the input stages may depend only on a threshold voltage of the first and second transistors and a resistance of the first and second resistors. The input transistors of the input stages may each have a width to length dimension ratio that does not depend upon either a width to length dimension ratio or an overdrive voltage of the first and second transistors. The width to length dimension ratio of each of the input transistors of the input stages may each have a width to length dimension ratio that is independent of a magnitude of the high supply voltage.

The first and second input nodes of the translator may each receive an input voltage having a voltage range within a first magnitude, and may provide an output voltage on the first and second output nodes that has a voltage range within a second magnitude that is greater than the first magnitude. In one embodiment, a translation ratio of the first magnitude to the second magnitude is less than 0.5, and is less than 0.2 in another embodiment.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The present invention uses an improved design by inserting resistors in series with the drains of the driven FETs to avoid the issues of the conventional design. The improved design works well at many combinations of input and output voltages. The improved design may be implemented with smaller-sized transistors with minimized gate-source capacitance to obtain high speed and smaller size. A low voltage to high voltage level translator as described herein provides a small and fast level translator that works equally well over a wide range of input and output voltages.

Figure 1:
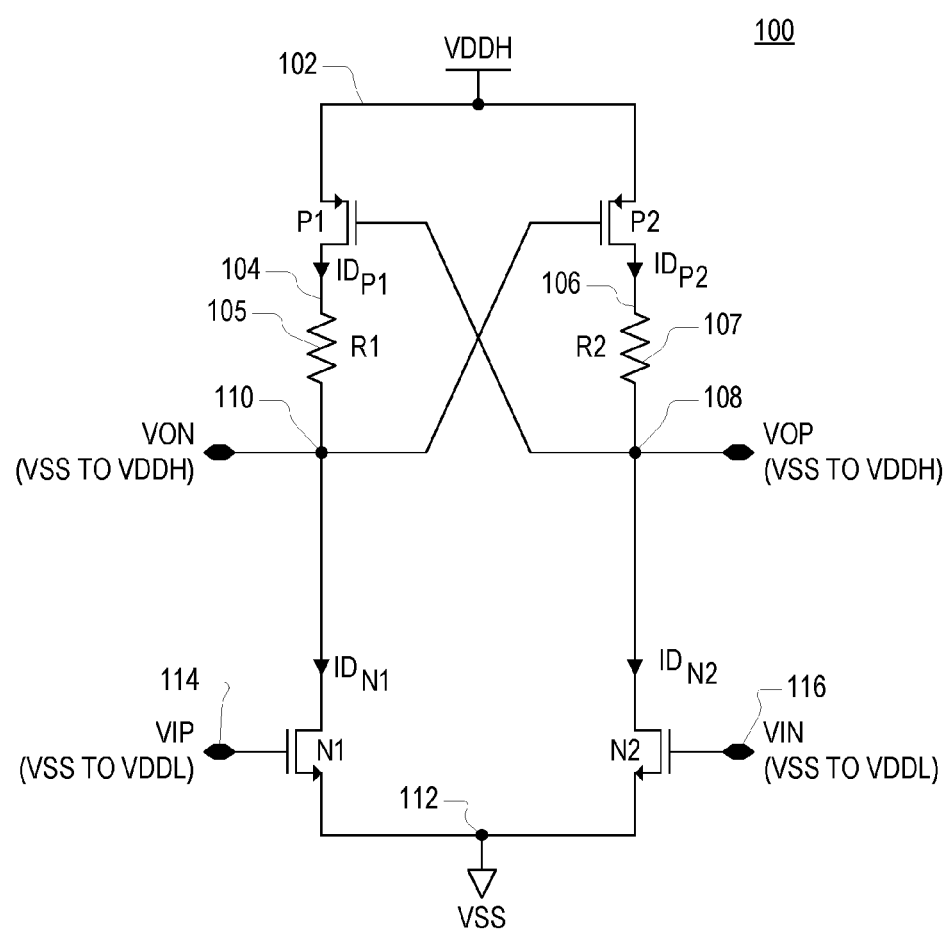
FIG. 1 is a schematic diagram of a voltage level translator implemented according to one embodiment of the present invention.

FIG. 1 is a schematic diagram of a voltage level translator 100 implemented according to one embodiment of the present invention. A supply voltage node 102 develops an upper supply voltage VDDH and another supply voltage node 112 develops a lower supply voltage VSS. VSS is any suitable negative, positive, or zero reference voltage level, which may be ground (GND) at 0 Volts (V). VDDH is any suitable upper supply voltage level for a given configuration. In one embodiment, VDDH is about 5V, although specific voltage levels are arbitrary and depend upon the particular implementation and configuration.

A first P-channel transistor P1 has its source terminal coupled to supply node 102 and its drain terminal coupled to a node 104. A second P-channel transistor P2 has its source terminal coupled to supply node 102 and its drain terminal coupled to another node 106. A resistor 105 with resistance R1 is coupled between node 104 and an output node 110 developing an output voltage VON, and another resistor 107 with resistance R2 is coupled between node 106 and an output node 108 developing an output voltage VOP. The control terminal (or gate) of P1 is coupled to node 108 and the control terminal (or gate) of P2 is coupled to node 110 in cross-coupled fashion. A first N-channel transistor N1 has its source terminal coupled to supply node 112, its drain terminal coupled to output node 110, and its gate terminal coupled to a first input node 114 receiving a "positive" input voltage VIP. A second N-channel transistor N2 has its source terminal coupled to supply node 112, its drain terminal coupled to output node 108, and its gate terminal coupled to a second input node 116 receiving a "negative" input voltage VIN. The drain currents of the transistors P1, P2, N1 and N2 are shown as $ID_{P1}$, $ID_{P2}$, $ID_{N1}$, and $ID_{N2}$, respectively.

The input voltages VIP and VIN may be the positive and negative polarities, respectively, of a differential input voltage provided to the voltage level translator 100, and the output voltages VOP and VON may be the positive and negative polarities, respectively, of a differential output voltage provided by the voltage level translator 100. Each of the input voltages VIP and VIN have a voltage range from VSS to a lower supply voltage level VDDL, and each of the output voltages VOP and VON have a voltage range from VSS to the upper voltage level VDDH. The magnitude of VDDH is greater than the magnitude of VDDL, so that the input voltage range is less than the output voltage range. In this manner, the voltage level translator 100 translates an input signal operating within the lower input voltage range of VSS to VDDL to an output signal operating within the higher input voltage range of VSS to VDDH. The low to high translation ratio for the voltage level translator 100 is VDDL/VDDH. The transistors N1, N2, P1 and P2 are each implemented as higher voltage transistors since each is exposed to the higher voltage range of VSS to VDDH during operation.

As used herein, the notations "P" and "N" denote different conductivity types, such as positive and negative conductivity or the like. P1 and P2 are P-type transistor devices and N1 and N2 are N-type transistor devices. In general, each transistor device has first and second current terminals and a control terminal. The transistors N1, N2, P1 and P2 may each be implemented with one or more MOS (metal-oxide semiconductor), FET (field-effect transistor), or MOSFET devices, in which the current terminals are the drain and source terminals and the control terminal is the gate terminal, and which may be more specifically referred to as P-channel and N-channel transistors. In the illustrated embodiments, each transistor has a drain-to-source voltage ($V_{DS}$), a gate-to-source voltage ($V_{GS}$), and a FET threshold voltage $V_t$. The width (W) and length (L) of the P-channel transistors are Wp and Lp, respectively, while the width and length of the N-channel transistors are Wn and Ln, respectively. Each transistor has a k' factor that depends upon the conductivity type (e.g., P-type or N-type), its mobility μ, its gate oxide thickness $t_{ox}$, and the permittivity of the gate oxide $\epsilon_{ox}$. The k' factor for an N-channel transistor is $k_n'=\mu_n\epsilon_{ox}/t_{ox}$ and the k' factor for a P-channel transistor is $k_p'=\mu_p\epsilon_{ox}/t_{ox}$. In general, $\mu_n$ is usually 2 to 3 times greater than $\mu_p$. The gate oxide thickness of the transistor depends on the gate-to-source operating voltage. Complex integrated circuit (IC) processes often have an array of NMOS and PMOS FETs to choose from. Choosing different threshold voltages, if available, may lead to more optimal circuit performance.

MOSFETs have two general areas of operation, including an active region and a triode region. In the active region, $V_{DS}>V_{GS}-V_t$, whereas in the triode region, $V_{DS}<V_{GS}-V_t$. The active region drain current ID is according to the following equation (1):

$$ID=(k'/2)(W/L)(V_{GS}-V_t)^2 \qquad (1)$$

and the triode region drain current ID is according to the following equation (2):

$$ID=(k'/2)(W/L)[2(V_{GS}-V_t)V_{DS}-(V_{DS})^2] \qquad (2)$$

in which $V_t$ and k' are replaced by $V_{tn}$ and the expression for $k_n'$, respectively, for the N-channel transistor and by $V_{tp}$ and the expression for $k_p'$ for the P-channel transistor. The equations (1) and (2) are approximate formulas. In equation (2), when $V_{ds}$ is small compared with $V_{GS}-V_t$, then the $V_{DS}^2$ term can be ignored. ID is now proportional to $V_{DS}$ which makes the drain characteristics look like a resistor value $1/[(k'/2)(W/L)2(V_{GS}-V_t)]$.

In a conventional level translator, the resistors 105 and 107 are not included so that the drain terminals of P1 and P2 are instead connected directly to the output nodes 110 and 108, respectively. In the conventional level translator, the PMOS transistors usually have long channel lengths while the NMOS transistors usually have wide channel widths. The conventional level translator, assuming the resistors 105 and 107 are omitted or otherwise shorted (R1=R2=0), operates in the following manner. The input voltages VIP and VIN collectively form a differential signal such that when VIP is at VDDL, VIN is at VSS and vice-versa. Assuming that initially VIP is at VDDL, N1 is turned on and conducting current while N2 is turned off and thus not conducting current. N1 pulls the voltage VON at node 110 to VSS and P2 is turned on to pull the voltage VOP of node 108 high to VDDH, so that P1 is turned off. P2 operates in its triode region and thus behaves as a resistor.

When VIP goes to VSS and VIN goes to VDDL, N1 is turned off while N2 is turned on. The voltage VON of node 110, however, is still at about 0V (or the voltage of VSS), so that the $V_{GS}$ of P2 is at about −VDDH and is still in its triode region of operation. In order to turn P1 on, the current through N2 needs to exceed the current through P2. The point at which P1 begins to turn on occurs approximately when the $V_{GS}$ of P1 equals its threshold voltage $V_{tp}$ (which is also the $V_{DS}$ of P2). The turn on point occurs when $ID_{N2}$ (drain current of N2) is equal to the $ID_{P2}$ (drain current of P2) according to the following equation (3):

$$(k_n'/2)(W_n/L_n)(V_{GSN2}-V_{tN2})^2=(k_p'/a2)(W_p/L_p)[2(V_{GSP2}-V_{tp2})V_{DSP2}-(V_{DSP2})^2] \qquad (3)$$

where $V_{DSP2}=V_{tp}$. For simplification, an overdrive voltage $V_{OD}$ for a transistor is its gate-source voltage minus its threshold voltage, or $V_{OD}=V_{GS}-V_t$. For P-channel transistors (including P2), $V_{ODP}=V_{GSP}-V_{tp}$, and N-channel transistors (including N2), $V_{ODN}=V_{GSN}-V_{tn}$. Equation (3) (for $V_{DSP2}=V_{tp}$) may now be expressed according to the following equation (4):

$$(k_n'/2)(W_n/L_n)(V_{ODN}^2)=(k_p'/2)(W_p/L_p)[2(V_{ODP})V_{tp}-V_{tp}^2] \qquad (4)$$

Solving for Wn/Ln leads to the following equation (5):

$$Wn/Ln = (k'_p/2)(Wp/Lp)[2V_{ODP}V_{tp} - V_{tp}^2]/[(k'_n/2)V_{ODN}^2] = \quad (5)$$
$$(k'_p/k'_n)(Wp/Lp)(2V_{ODP}V_{tp} - V_{tp}^2)/V_{ODN}^2$$

For the conventional level translator (in which the resistors 105 and 107 are removed or otherwise shorted) in which VDDH=5V and VDDL=3V, 5V FETs with $V_t$=0.8V, an overdrive voltage $V_{ODN}$=2.2V for the N-type transistors, and an overdrive voltage $V_{ODP}$=4.2V for the P-type transistors, then equation (5) resolves to the following equation (6):

$$Wn/Ln = 1.256[(k'_p/2)/(k'_n/2)](Wp/Lp) \quad (6)$$

Under the assumption that both P- and N-type transistors are 5V FETs with the same gate oxide thickness, the ratio of $(k'_p/2)/(k'_n/2)$ is about 0.4, giving Wn/Ln=0.5(Wp/Lp). This would allow the use of small sized FETs when the resistors 105 and 107 are removed in the conventional configuration, but only when the input voltage is no less than about half of the output voltage.

For the conventional level translator when VDDH=5V (the same) and VDDL=1V (rather than 3V), the overdrive voltage $V_{ODN}$ drops to about 0.2V, which is about 11 times weaker than the case in which VDDL=3V. In this case, Wn/Ln is about 60 times larger than Wp/Lp. This might be accommodated by making Wn=8Wp and Lp=8Ln. The area of both transistors, however, has increased 8 times, which means that the input N-channel transistors now have 8 times the gate capacitance as before, and the same holds true for the P-channel transistors. Large gate capacitance needs to be charged/discharged before the opposing drain voltage starts to move, which results in slow output transitions. In conclusion, when the input voltage is reduced to reduce the low to high transition ratio below VDDL/VDDH=0.5 in the conventional level translator configuration, the overall size is substantially increased and the speed is significantly reduced.

The voltage level translator 100 including the resistors 105 and 107 resolves the issues posed by the conventional configuration. In order to turn on the corresponding P-channel transistor, the driving N-channel transistor need only supply sufficient current to induce a voltage drop across the resistor equal to the voltage threshold $V_{tp}$ of the P-channel transistor. In the example above, $V_{tp}$=0.8V, and if the resistances R1=R2=R=150 kilo-ohms (kΩ), then the resistor current is 0.8V/150 kΩ=5.3 microamperes (μA) (ignoring the FET ON resistance). When the ON resistance is considered, then the resistor is in series with the ON resistance of the P-channel transistor resulting in a higher total resistance, so that the target voltage (e.g., 0.8V) is achieved with a smaller current level. When the resistors 105 and 107 are added each with a resistance R, and substituting $V_{ODN}$, equation (4) is rewritten to equation (7) as follows:

$$(k'_n/2)(Wn/Ln)(V_{ODN}^2) = V_{tp}/R \quad (7)$$

and equation (5) may be rewritten as equation (8) as follows:

$$Wn/Ln = (V_{tp}/R)/[(k'_n/2)(V_{ODN})^2] \quad (8)$$

As shown by equation (8), the dimensions of the P-channel transistor and its overdrive voltage ($V_{ODP}$) have been removed by the inclusion of the resistors, so that the performance of the voltage level translator 100 is independent of the output supply voltage VDDH.

Figure 2:
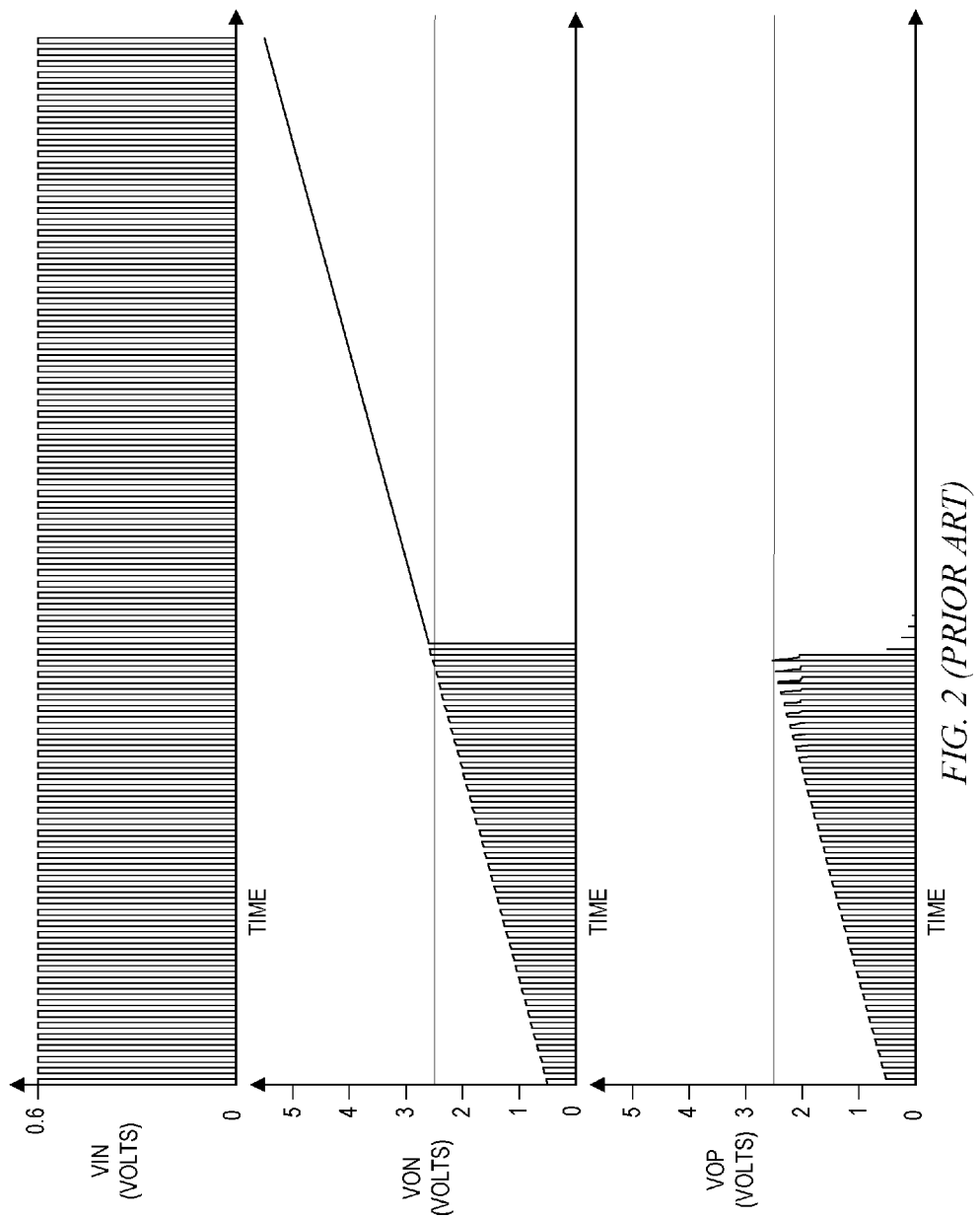
FIG. 2 is a set of timing diagrams illustrating simulated operation of a conventional voltage level translator.

FIG. 2 is a set of timing diagrams illustrating simulated operation of a conventional voltage level translator. The conventional voltage level translator is similar in configuration to the voltage level translator 100 except with the resistors R1 and R2 removed or otherwise shorted. The set of timing diagrams shown in FIG. 2 include a first timing diagram plotting VIN (in Volts) versus time, a second timing diagram plotting VON (in Volts) versus time, and a third timing diagram plotting VOP (in Volts) versus time. VIN is simulated with a square-wave signal toggling between VSS (0V) and 0.6V. In one embodiment, the square-wave is 10 Megahertz (MHz). Although VIP is not shown, VIP toggles in a similar but opposite manner as that of VIN, so that when VIN is 0.6V, VIP is 0V and vice-versa. Generally, VIN and VIP are simulated together with a differential square wave input voltage that toggles between 0V and 0.6V. Meanwhile, the upper supply voltage VDDH ramps from a low value of about 0.5V to a high value of about 5.5V.

As shown in the second timing diagram, when VIN is asserted high (while VIP is asserted low), VON goes high to the voltage level of VDDH, and when VIN goes low (while VIP is asserted high), VON goes low to VSS (0V). As VDDH is ramped up, the magnitude of the high level of VON rises accordingly in each switching cycle as shown. As shown in the third timing diagram, VOP toggles between VSS and the voltage level of VDDH in a similar manner as VON, except in the opposite direction. Thus, when VON goes high, VOP goes low and vice-versa. At the lower voltage levels of VDDH up to about 2.5V, operation is as expected in which the differential output (VOP, VON) toggles between low and high voltages in response to the square wave simulation of the differential input voltage (VIP, VIN).

When the upper supply voltage VDDH reaches about 2V, however, VOP starts to distort when approaching the VDDH level. As VDDH rises above 2.5V, the conventional voltage level translator stops switching altogether. At the higher voltage levels of VDDH in the conventional configuration, the N-channel transistors N1 and N2 are unable to supply enough current to overcome the ON resistances of the P-channel transistors P2 and P1, respectively. When process variations and operating margins of error are considered, the conventional configuration provides suitable operation for a translation ratio only down to about 0.4.

Figure 3:
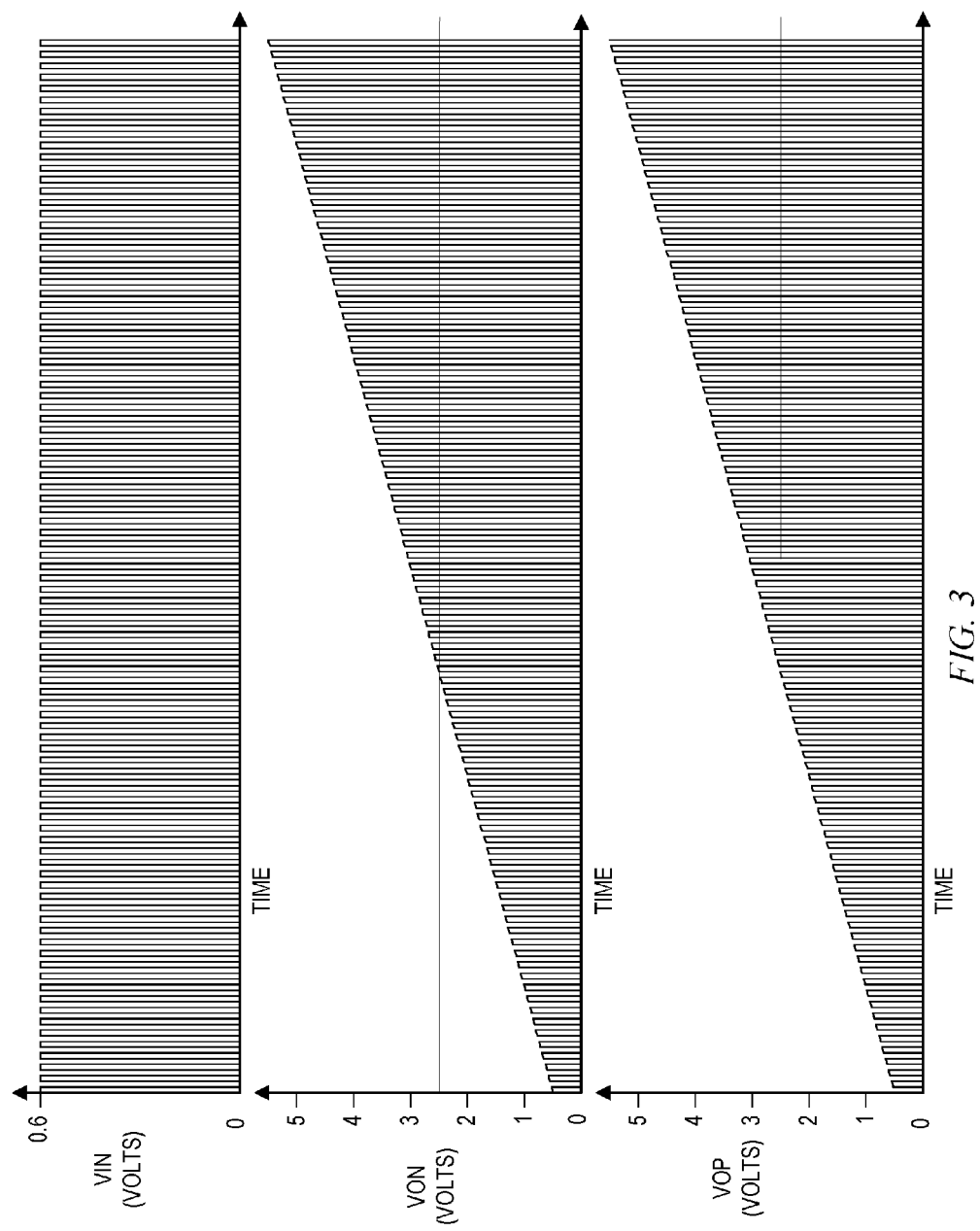
FIG. 3 is a set of timing diagrams illustrating simulated operation of the voltage level translator of FIG. 1 with the added resistors.

FIG. 3 is a set of timing diagrams illustrating simulated operation of the voltage level translator 100. In this case, the resistors R1 and R2 are included. Again, the set of timing diagrams shown in FIG. 3 include a first timing diagram plotting VIN (in Volts) versus time, a second timing diagram plotting VON (in Volts) versus time, and a third timing diagram plotting VOP (in Volts) versus time. Also, although only VIN is shown in the first diagram, it is understood that VIN and VIP are simulated to opposite polarities with the same differential square wave input voltage that toggles between 0V and 0.6V. Also, similar to that shown in FIG. 2, the upper supply voltage VDDH ramps from a low value of about 0.5V to a high value of about 5.5V.

As shown in the second timing diagram of FIG. 3, when VIN is asserted high (while VIP is asserted low), VON goes high to the voltage level of VDDH, and when VIN goes low (while VIP is asserted high), VON goes low to VSS (0V). As VDDH is ramped up, the magnitude of the high level of VON rises accordingly in each switching cycle as shown. As shown in the third timing diagram of FIG. 3, VOP toggles between VSS and the voltage level of VDDH in a similar manner as VON, except in the opposite direction. Thus, when VON goes high, VOP goes low and vice-versa. At the lower voltage levels of VDDH up to about 2.5V, operation is as expected in which the differential output (VOP, VON)

toggles between low and high voltages in response to the square wave simulation of the differential input voltage (VIP, VIN).

The magnitudes of VOP and VON continue to rise as VDDH ramps up above 2.5V all the way to the maximum of 5.5V. In this manner, even as the output voltage increases to almost 10 times the input voltage, with a low to high translation ratio down to about 0.1, the differential output voltage VOP, VON follows the pattern of the differential input voltage at the higher voltage levels of VDDH. Operation does not fail at the higher voltage levels since the N-channel transistors N1 and N2 only need to supply sufficient current to get a sufficient voltage drop across the resistors R1 and R2, respectively, to switch the P-channel transistors P2 and P1, respectively.

As can be determined from equation (5) above, Wn/Ln depends on both $V_{ODP}$ and $V_{ODN}$, which in turn depend on the supply voltages for the P-channel and N-channel transistors in the conventional voltage level translator. As the input and output voltages vary, Wn/Ln necessarily varies as well. If the input and output voltages are known and fixed beforehand, then Wn/Ln (and Wp/Lp) can both be adjusted. As previously noted, when the input and output voltages are sufficiently close, then the transistor sizes and dimensions may be adjusted for optimal performance. As the input and output voltages diverge with respect to each other, such as when the lower voltage level decreases below 3V (such as down to 1V or even less), performance is compromised as shown in FIG. 2. Furthermore, a desired performance level may not be achievable even when sizing the transistors. For example, the size of the transistors may become too large and unwieldy thereby consuming valuable space and substantially slowing down switching speed.

On the other hand, as can be determined from equation (8) above, Wn/Ln does not depend upon the dimensions of the P-channel transistor, or Wp/Lp, and further does not depend upon $V_{ODP}$. Instead, Wn/Ln only depends upon the P-channel threshold voltage $V_{tp}$ and the resistance of the added resistors, or R1 and R2 (in which the resistances may be made the same, or R1=R2=R). In this manner, there is no ratio involved since $V_{ODP}$ is absent. Performance is independent of the upper supply voltage VDDH as desired. As demonstrated by FIG. 3, the voltages can diverge significantly without compromising performance.

Figure 4:
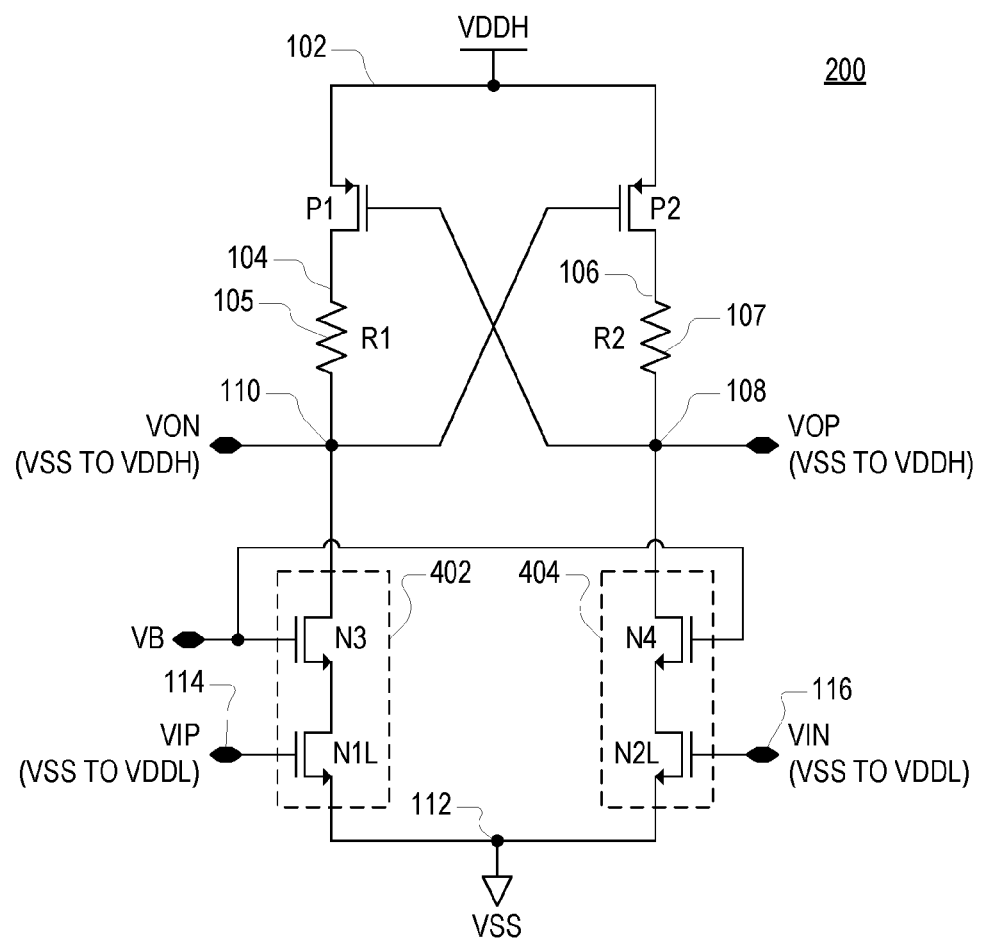
FIG. 4 is a schematic diagram of another voltage level translator implemented with cascode input stages according to another embodiment of the present invention.

FIG. 4 is a schematic diagram of another voltage level translator 200 implemented with cascode input stages according to another embodiment of the present invention. The voltage level translator 200 is substantially similar to the voltage level translator 100 including the P-channel transistors P1 and P2 and the resistors 105 and 107 coupled in the same manner. The N-channel transistors N1 and N2, however, are replaced by input stages 402 and 404, respectively. Each of the input stages 402 and 404 is configured as a cascode stage including a low voltage input transistor and an isolation transistor to isolate the low voltage transistor from the higher voltage levels of the output.

In general, the higher voltage input transistors N1 and N2 are replaced by low voltage N-channel transistors N1L and N2L, respectively, each having a source terminal coupled to the supply voltage node 112 (e.g., VSS). The gate terminal of N1L is coupled to the first input node 114 to receive VIP and the gate terminal of N2L is coupled to the second input node 116 to receive VIN. Also, higher voltage N-channel cascode transistors N3 and N4 are added to isolate the low voltage transistors N1L and N2L from the higher voltage level of VDDH. The drain terminal of N1L is coupled to the source terminal of N3, which has its drain terminal coupled to the output node 110 developing VON. The drain terminal of N2L is coupled to the source terminal of N4, which has its drain terminal coupled to the output node 108 developing VOP. Thus, the input stage 402 includes the cascoded transistors N1L and N3 and the input stage 404 includes the cascoded transistors N2L and N4. A bias voltage VB is provided to the gate terminals of N3 and N4.

The voltage level translator 200 operates in substantially the same manner as the voltage level translator 100. The isolation transistors N3 and N4 are higher voltage transistors capable of withstanding the full voltage range of VDDH. The input transistors N1L and N2L are lower voltage transistors not capable of withstanding the full voltage range of VDDH but able to handle the full voltage range of VDDL. Some IC processes include high voltage FETs with standard threshold voltages which do not include the high voltage FETs with lower or medium level threshold voltages, but do include low voltage FETs with the lower or medium level threshold voltages. When the input voltage is relatively low, such as around 1V to 2V, it may be desired to have input transistors with the lower or medium level threshold voltages. If the desired lower or medium threshold voltages are not available with the higher voltage transistors, then the cascode configuration may be used. If, however, the desired lower or medium threshold voltages are available with the higher voltage transistors, then the cascode configurations are unnecessary.

In a more specific configuration, 5V FETs have standard threshold voltages of about 0.8V, whereas a medium threshold voltage is about 0.45V. If 5V FETs are not available with a lower threshold voltage (e.g., about 0.45V), then low voltage FETs (commonly rated at 2V) with lower thresholds (e.g., about 0.45V) may be used in the cascode configuration. The low threshold voltages mean that the overdrive voltage for these FETs can be about half a volt when using a 1V operating voltage.

In a more specific configuration of the voltage level translator 200, the resistors R1 and R2 each have a resistance of about 106 kΩ, P1 and P2 are 5V standard $V_{tp}$ PMOS FETs with W/L=1 micrometer (μm)/500 nanometers (nm), N3 and N4 are standard $V_{tn}$ 5V NMOS FETs with W/L=3 μm/600 nm, and N1L and N2L are standard 1.8V NMOS FETs with W/L=2 μm/300 nm.

Figure 5:
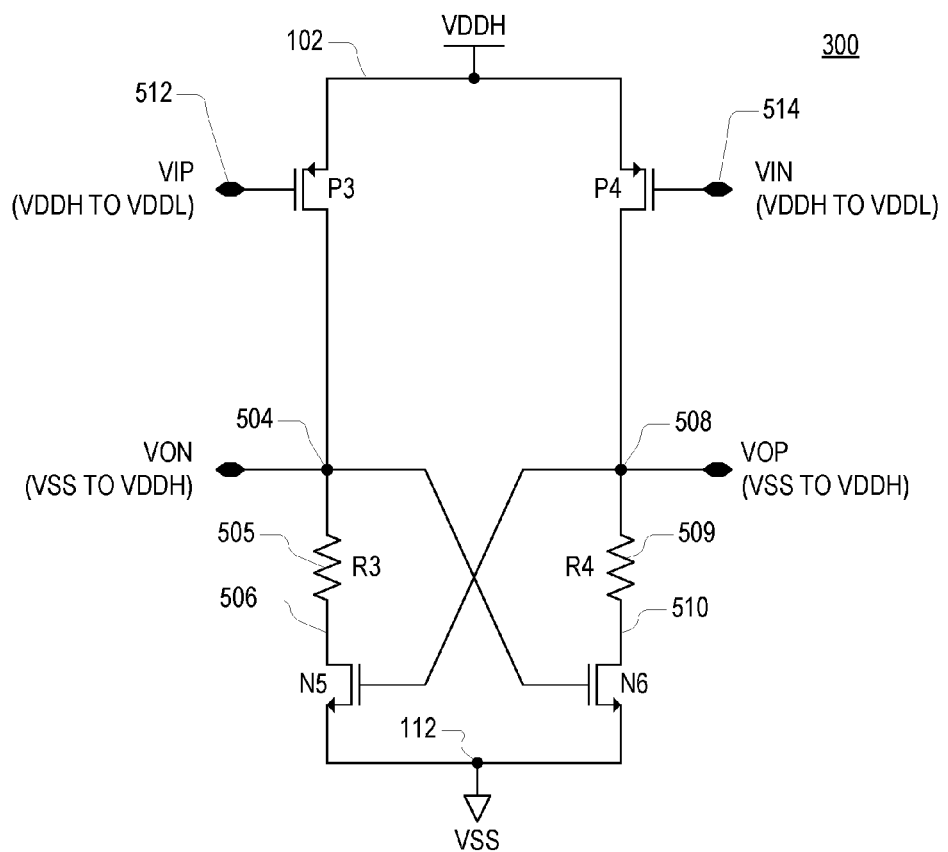
FIG. 5 is a schematic diagram of another voltage level translator implemented in an inverted configuration according to yet another embodiment of the present invention.

FIG. 5 is a schematic diagram of another voltage level translator 300 implemented in an inverted configuration according to yet another embodiment of the present invention. In this case, the configuration of the voltage level translator 100 of FIG. 1 is effectively turned "upside down" (or inverted) in which relatively weak input P-channel transistors P3 and P4 are used to drive stronger N-channel transistors N5 and N6 in a cross-coupled configuration with resistors 505 and 509 with resistances R3 and R4, respectively. The current terminals of the P-channel and N-channel transistors are coupled between the supply nodes 102 (VDDH) and 112 (VSS) in substantially similar manner. As shown, the source terminals of P3 and P4 are coupled to VDDH via supply node 102, the drain terminal of P3 is coupled to a node 504 and the drain terminal of P4 is coupled to a node 508. The resistor 505 is coupled between node 504 and a node 506 and the resistor 509 is coupled between node 508 and a node 510. N5 has its drain terminal coupled to node 506 and its source terminal coupled to the supply node 112, and N6 has its drain terminal coupled to node 510 and its source terminal coupled to the supply node 112.

In this case, however, input nodes 512 and 514 for receiving the input voltages VIP and VIN, respectively, are coupled to the gate terminals of P3 and P4, respectively. The nodes 504 and 508 form the output nodes for providing the output voltages VON and VOP, respectively. The gate terminal of N5 is coupled to the output node 508 and the gate terminal of N6 is coupled to the output node 504 in cross-coupled fashion. The input voltages VIP and VIN each switch within the voltage range of VDDH to VDDL, and the output voltages VON and VOP each switch within the full higher voltage range of VSS to VDDH. In this manner, the translation ratio is (VDDH−VDDL)/VDDH. Each of the transistors P3, P4, N5 and N6 are higher voltage transistors capable of switching within the higher voltage range of VDDH. It is noted that the voltage level of VDDL may be closer to VDDH in the inverted configuration.

The constraint for the size of the P-channel transistors P3 and P4 is according to the following equation (9):

$$Wp/Lp = (k_n'/k_p')(Wn/Ln)(2V_{ODN}V_{tn} - V_{tn}^2)/V_{ODP}^2 \quad (9)$$

When the resistors 505 and 509 are added such that R3=R4=R, the constraint for the size of the P-channel transistors P3 and P4 is according to the following equation (10):

$$Wp/Lp = (V_{tn}/R)/[(k_p'/2)(V_{ODP})^2] \quad (10)$$

As can be determined from equation (10), Wp/Lp does not depend upon the dimensions of the N-channel transistor, or Wn/Ln, and further does not depend upon VoDN. Instead, Wp/Lp only depends upon the N-channel threshold voltage $V_{tn}$ and the resistance of the added resistors, or R3 and R4 (in which the resistances may be made the same, or R3=R4=R). In this manner, there is no ratio involved since $V_{ODN}$ is absent. Performance is independent of the difference between the input and output voltage ranges based on the translation ratio of (VDDH−VDDL)/VDDH.

Figure 6:
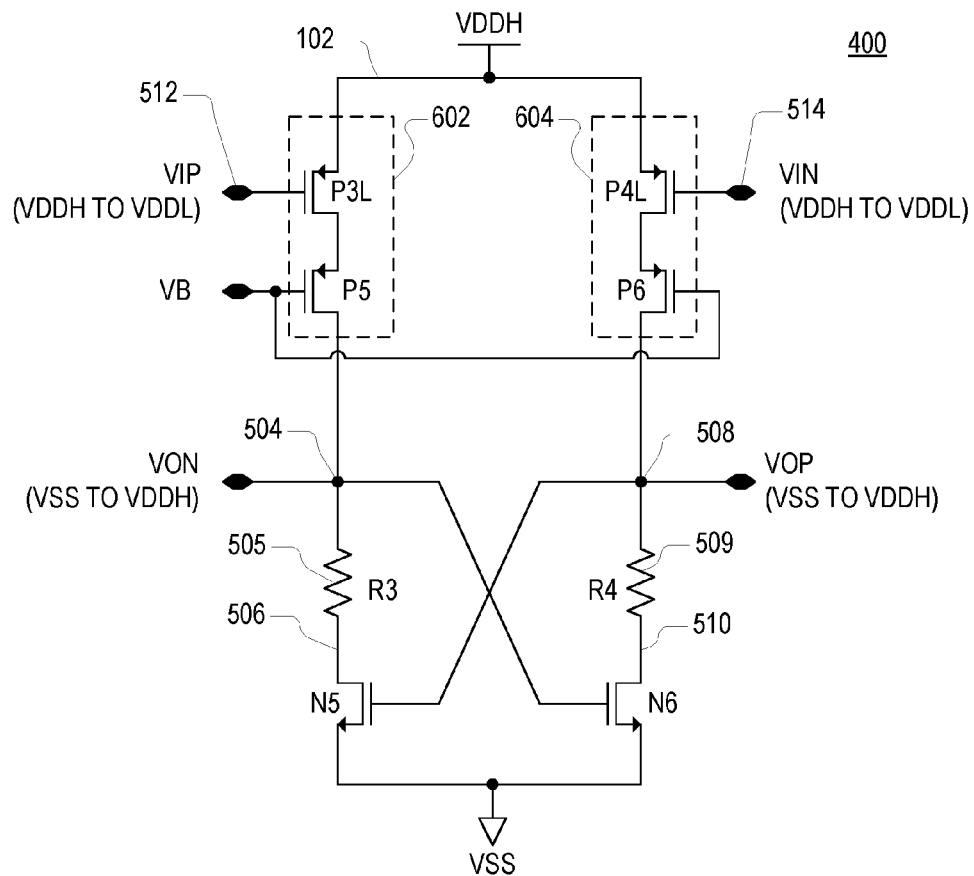
FIG. 6 is a schematic diagram of another voltage level translator implemented in an inverted configuration and with cascode input stages according to another embodiment of the present invention.

FIG. 6 is a schematic diagram of another voltage level translator 400 implemented in an inverted configuration and with cascode input stages according to another embodiment of the present invention. The voltage level translator 400 is substantially similar to the voltage level translator 300 except that the input transistors P3 and P4 are replaced with cascode input stages 602 and 604, respectively. The cascode input stages 602 and 604 are used for similar reasons described above as for the cascode input stages 402 and 404. P3 and P4 are higher voltage transistors which have suitable threshold voltages. If it is desired or if there is a need to use lower voltage transistors with suitable threshold voltages, then the transistors P3L and P4L are used instead with higher voltage, cascode P-channel transistors P5 and P6, respectively. The source terminals of P3L and P4L are coupled to the supply node 102 as before, but their drain terminals are coupled to the source terminals of P5 and P6, respectively, and the drain terminals of P5 and P6 are coupled to the output nodes 504 and 508, respectively. The input nodes 512 and 514 are provided to the gate terminals of P3L and P4L, respectively, and a bias voltage VB is provided to the gate terminals of P5 and P6. Operation of the voltage level translator 400 is substantially similar to that of the voltage level translator 300. Again, the voltage level of VDDL may be closer to VDDH in the inverted configuration.

The resistors in any of the configurations may be removed only under certain configuration considerations. As an example, assume that the driven transistors (e.g., P1 and P2 for the voltage level translators 100 and 200, or N5 and N6 for the voltage level translators 300 and 400) have a width to length ratio (W/L)=1. Then equation (5) may be re-written according to the following equation (11):

$$Wn/Ln = (k_p'/k_n')(2V_{ODP}V_{tp} - V_{tp}^2)/V_{VDN}^2 \quad (11)$$

in which $k_p'/k_n'$ is typically about 0.4. Also, equation (9) may be re-written according to the following equation (12):

$$Wp/Lp = (k_n'/k_p')(2V_{ODN}V_{tn} - V_{tn}^2)/V_{ODP}^2 \quad (12)$$

in which $k_n'/k_p'$ is typically about 2.5. The resistors should be added if W/L in either case exceeds a certain ratio that would compromise performance.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. A low voltage to high voltage level translator, comprising:
    a first transistor of a first conductivity type having a first current terminal coupled to a first supply voltage, having second current terminal, and having a control terminal coupled to a first output node;
    a second transistor of said first conductivity type having a first current terminal coupled to said first supply voltage, having second current terminal, and having a control terminal coupled to a second output node;
    a first resistor having a first terminal coupled to said second current terminal of said first transistor of said first conductivity type, and having a second terminal coupled to said second output node;
    a second resistor having a first terminal coupled to said second current terminal of said second transistor of said first conductivity type, and having a second terminal coupled to said first output node;
    a first input stage of a second conductivity type having a first current terminal coupled to a second supply voltage, having a second current terminal coupled to said second output node, and having a control terminal coupled to a first input node;
    a second input stage of said second conductivity type having a first current terminal coupled to said second supply voltage, having a second current terminal coupled to said first output node, and having a control terminal coupled to a second input node;
    wherein said first input stage comprises a first transistor of said second conductivity type and wherein said second input stage comprises a second transistor of said second conductivity type; and
    wherein said first and second transistors of said second conductivity type each have a width to length dimension ratio that depends only on a threshold voltage of said first and second transistors of said first conductivity type and a resistance of said first and second resistors.

2. The low voltage to high voltage level translator of claim 1, wherein said first conductivity type comprises P-type and wherein said second conductivity type comprises N-type.

3. The low voltage to high voltage level translator of claim 1, wherein said first and second transistors of said first conductivity type comprise P-channel transistors and wherein said first and second input stages of said second conductivity type comprise N-channel transistors.

4. The low voltage to high voltage level translator of claim 3, wherein said P-channel transistors and said N-channel transistors comprise field-effect transistors.

5. The low voltage to high voltage level translator of claim 3, wherein said P-channel and N-channel transistors comprise MOS transistors.

6. The low voltage to high voltage level translator of claim 1, wherein said first conductivity type comprises N-type and wherein said second conductivity type comprises P-type.

7. The low voltage to high voltage level translator of claim 1, wherein said first and second transistors of said first conductivity type comprise N-channel transistors and wherein said first and second input stages of said second conductivity type comprise P-channel transistors.

8. The low voltage to high voltage level translator of claim 7, wherein said P-channel transistors and said N-channel transistors comprise field-effect transistors.

9. The low voltage to high voltage level translator of claim 7, wherein said P-channel and N-channel transistors comprise MOS transistors.

10. A low voltage to high voltage level translator, comprising:
   a first transistor of a first conductivity type having a first current terminal coupled to a first supply voltage, having second current terminal, and having a control terminal coupled to a first output node;
   a second transistor of said first conductivity type having a first current terminal coupled to said first supply voltage, having second current terminal, and having a control terminal coupled to a second output node;
   a first resistor having a first terminal coupled to said second current terminal of said first transistor of said first conductivity type, and having a second terminal coupled to said second output node;
   a second resistor having a first terminal coupled to said second current terminal of said second transistor of said first conductivity type, and having a second terminal coupled to said first output node;
   a first input stage of a second conductivity type having a first current terminal coupled to a second supply voltage, having a second current terminal coupled to said second output node, and having a control terminal coupled to a first input node;
   a second input stage of said second conductivity type having a first current terminal coupled to said second supply voltage, having a second current terminal coupled to said first output node, and having a control terminal coupled to a second input node;
   wherein said first input stage comprises a first transistor of said second conductivity type and wherein said second input stage comprises a second transistor of said second conductivity type; and
   wherein said first and second transistors of said second conductivity type each have a width to length dimension ratio that does not depend upon either a width to length dimension ratio or an overdrive voltage of said first and second transistors of said first conductivity type.

11. A low voltage to high voltage level translator, comprising:
   a first transistor of a first conductivity type having a first current terminal coupled to a first supply voltage, having second current terminal, and having a control terminal coupled to a first output node;
   a second transistor of said first conductivity type having a first current terminal coupled to said first supply voltage, having second current terminal, and having a control terminal coupled to a second output node;
   a first resistor having a first terminal coupled to said second current terminal of said first transistor of said first conductivity type, and having a second terminal coupled to said second output node;
   a second resistor having a first terminal coupled to said second current terminal of said second transistor of said first conductivity type, and having a second terminal coupled to said first output node;
   a first input stage of a second conductivity type having a first current terminal coupled to a second supply voltage, having a second current terminal coupled to said second output node, and having a control terminal coupled to a first input node;
   a second input stage of said second conductivity type having a first current terminal coupled to said second supply voltage, having a second current terminal coupled to said first output node, and having a control terminal coupled to a second input node;
   wherein said first input stage comprises a first transistor of said second conductivity type and wherein said second input stage comprises a second transistor of said second conductivity type; and
   wherein said first and second transistors of said second conductivity type each have a width to length dimension ratio that is independent of a magnitude of said first supply voltage relative to said second supply voltage.

12. A low voltage to high voltage level translator, comprising:
   a first transistor of a first conductivity type having a first current terminal coupled to a first supply voltage, having second current terminal, and having a control terminal coupled to a first output node;
   a second transistor of said first conductivity type having a first current terminal coupled to said first supply voltage, having second current terminal, and having a control terminal coupled to a second output node;
   a first resistor having a first terminal coupled to said second current terminal of said first transistor of said first conductivity type, and having a second terminal coupled to said second output node;
   a second resistor having a first terminal coupled to said second current terminal of said second transistor of said first conductivity type, and having a second terminal coupled to said first output node;
   a first input stage of a second conductivity type having a first current terminal coupled to a second supply voltage, having a second current terminal coupled to said second output node, and having a control terminal coupled to a first input node;
   a second input stage of said second conductivity type having a first current terminal coupled to said second supply voltage, having a second current terminal coupled to said first output node, and having a control terminal coupled to a second input node;
   wherein said first input stage comprises:
      a first transistor of said second conductivity type having a first current terminal coupled to said second supply voltage, having a second current terminal, and having a control terminal coupled to said first input node; and
      a second transistor of said second conductivity type having a first current terminal coupled to said second current terminal of said first transistor of said second conductivity type, having a second current terminal coupled to said second output node, and having a control terminal coupled to a bias voltage; and wherein said second input stage comprises:
a third transistor of said second conductivity type having a first current terminal coupled to said second supply voltage, having a second current terminal, and having a control terminal coupled to said second input node; and
a fourth transistor of said second conductivity type having a first current terminal coupled to said second current terminal of said third transistor of said second conductivity type, having a second current terminal coupled to said first output node, and having a control terminal coupled to said bias voltage.

13. The low voltage to high voltage level translator of claim 12, wherein said first and third transistors of said second conductivity type each have a width to length dimension ratio that depends only on a threshold voltage of said first and second transistors of said first conductivity type and a resistance of said first and second resistors.

14. The low voltage to high voltage level translator of claim 12, wherein said first and third transistors of said second conductivity type each have a width to length dimension ratio that does not depend upon either a width to length dimension ratio or an overdrive voltage of said first and second transistors of said first conductivity type.

15. The low voltage to high voltage level translator of claim 12, wherein said first and third transistors of said second conductivity type each have a width to length dimension ratio that is independent of a magnitude of said first supply voltage relative to said second supply voltage.

16. The low voltage to high voltage level translator of claim 12, wherein:
said first and second input nodes each receive an input voltage having a voltage range within a first magnitude, and wherein said first and second output nodes each provide an output voltage having a voltage range within a second magnitude that is greater than said first magnitude; and
wherein said first and third transistors of said second conductivity type each have a width to length dimension ratio that is independent of said second magnitude.

17. The low voltage to high voltage level translator of claim 12, wherein said first and second transistors of said first conductivity type comprise P-channel transistors, and wherein said first, second, third and fourth transistors of said second conductivity type comprise N-channel transistors.

18. The low voltage to high voltage level translator of claim 12, wherein said first and second transistors of said first conductivity type comprise N-channel transistors, and wherein said wherein said first, second, third and fourth transistors of said second conductivity type comprise P-channel transistors.

19. A low voltage to high voltage level translator, comprising:
a first transistor of a first conductivity type having a first current terminal coupled to a first supply voltage, having second current terminal, and having a control terminal coupled to a first output node;
a second transistor of said first conductivity type having a first current terminal coupled to said first supply voltage, having second current terminal, and having a control terminal coupled to a second output node;
a first resistor having a first terminal coupled to said second current terminal of said first transistor of said first conductivity type, and having a second terminal coupled to said second output node;
a second resistor having a first terminal coupled to said second current terminal of said second transistor of said first conductivity type, and having a second terminal coupled to said first output node;
a first input stage of a second conductivity type having a first current terminal coupled to a second supply voltage, having a second current terminal coupled to said second output node, and having a control terminal coupled to a first input node;
a second input stage of said second conductivity type having a first current terminal coupled to said second supply voltage, having a second current terminal coupled to said first output node, and having a control terminal coupled to a second input node; and
wherein said first and second input stages of said second conductivity type each comprise a cascode stage of a plurality of transistors of said second conductivity type.

* * * * *